United States Patent
Wu et al.

(10) Patent No.: US 8,530,317 B1
(45) Date of Patent: Sep. 10, 2013

(54) CORNER ROUNDING TO IMPROVE METAL FILL IN REPLACEMENT GATE PROCESS

(75) Inventors: Po-Chi Wu, Zhubei (TW); Buh-Kuan Fang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/587,123

(22) Filed: Aug. 16, 2012

(51) Int. Cl.
*H01L 21/336* (2006.01)

(52) U.S. Cl.
USPC .......... 438/301; 438/199; 438/216; 438/285; 438/299; 438/303; 257/314; 257/327; 257/328; 257/364; 257/369; 257/E21.444

(58) Field of Classification Search
None
See application file for complete search history.

(56) References Cited

U.S. PATENT DOCUMENTS

2006/0046448 A1* 3/2006 Barns et al. ................ 438/585

* cited by examiner

*Primary Examiner* — Kyoung Lee
(74) *Attorney, Agent, or Firm* — Eschweiler & Associates, LLC

(57) ABSTRACT

A replacement gate process for fabricating a semiconductor device with metal gates includes forming a dummy gate stack, patterning dummy gates, doping source and drain regions for the gates, and forming an inter-level dielectric layer that overlays the source and drain regions. The sacrificial layer of the dummy gates is removed to form trenches using a three stage process. The first stage begins the trenches, whereby trenches entrance corners are exposed. The second stage is an etch that rounds the corners. The third stage is a main etch for the sacrificial layer, which is typically polysilicon. The corner rounding of the second stage improves the performance of the third stage and results in a better metal back fill including a reduction in pit defects. The process improves overall device yield in comparison to an otherwise equivalent process that omits the corner rounding step.

20 Claims, 7 Drawing Sheets

US 8,530,317 B1

CORNER ROUNDING TO IMPROVE METAL FILL IN REPLACEMENT GATE PROCESS

FIELD

The present invention relates to integrated circuits and semiconductor device fabrication. In particular, the invention relates to a gate-last process that provides semi-conductor devices with high-k dielectric/metal gates.

BACKGROUND

In an effort to increase device densities, many years of research have been devoted to reducing critical dimensions (CDs) in semiconductor devices. Research has resulted in a long felt need to replace traditional gate structures with gates having high-k dielectrics and metal electrodes. High-k dielectrics can provide enhanced capacitance in comparison to an equivalent thickness of silicon dioxide. A metal electrode with suitable work function is desired to avoid charge carrier depletion proximate the electrode interface with the high-k dielectric. The electrodes for p-channel and n-channel transistors may require different metals to provide suitable work functions.

Suitable metals for gate electrodes can be adversely affected by processing used to form source and drain regions. In particular, annealing to repair source and drain implant damage can shift the work function of electrode metals. This has led to various new manufacturing processes, including replacement gate (gate-last) processes. In a replacement gate process, a gate stack is formed with polysilicon in place of the electrode metal. After source and drain regions are formed, the polysilicon is removed to form trenches which are then filled with the desired electrode metals.

Semiconductor devices are subject to thorough testing by manufacturers to ensure they meet performance standards. Devices that fail are discarded or recycled. Devices with high-k dielectrics and metal electrode gates manufactured by preexisting methods fail at a rate that reduces yield to an unacceptable degree. There has been a long felt need for a high yield process for incorporating high-k dielectric, metal electrode gates into semiconductor devices.

SUMMARY

The present disclosure provides a replacement gate process that can be used in fabricating a semiconductor device having metal gates. The method includes forming a dummy gate stack, patterning the dummy gates, doping source and drain regions for the gates, and forming an inter-level dielectric layer that overlays the source and drain regions. The sacrificial layer of the dummy gates is removed to form trenches using a process having three stages. The first stage begins the trenches, whereby entrance corners of the trenches are exposed. The second stage is an etch that rounds the entrance corners. The third stage is a main etch for removing the sacrificial layer, which is typically polysilicon. The corner rounding of the second stage improves the performance of the third stage and results in a better metal back fill including a reduction in pit defects. The process improves overall device yield in comparison to an otherwise equivalent process that omits the corner rounding step. The improvement in yield is achieved without significantly affecting critical dimensions.

The primary purpose of this summary has been to present certain of the inventors' concepts in a simplified form to facilitate understanding of the more detailed description that follows. This summary is not a comprehensive description of every one of the inventors' concepts or every combination of the inventors' concepts that can be considered "invention". Other concepts of the inventors will be conveyed to one of ordinary skill in the art by the following detailed description together with the drawings. The specifics disclosed herein may be generalized, narrowed, and combined in various ways with the ultimate statement of what the inventors claim as their invention being reserved for the claims that follow.

DETAILED DESCRIPTION

Figure 1:
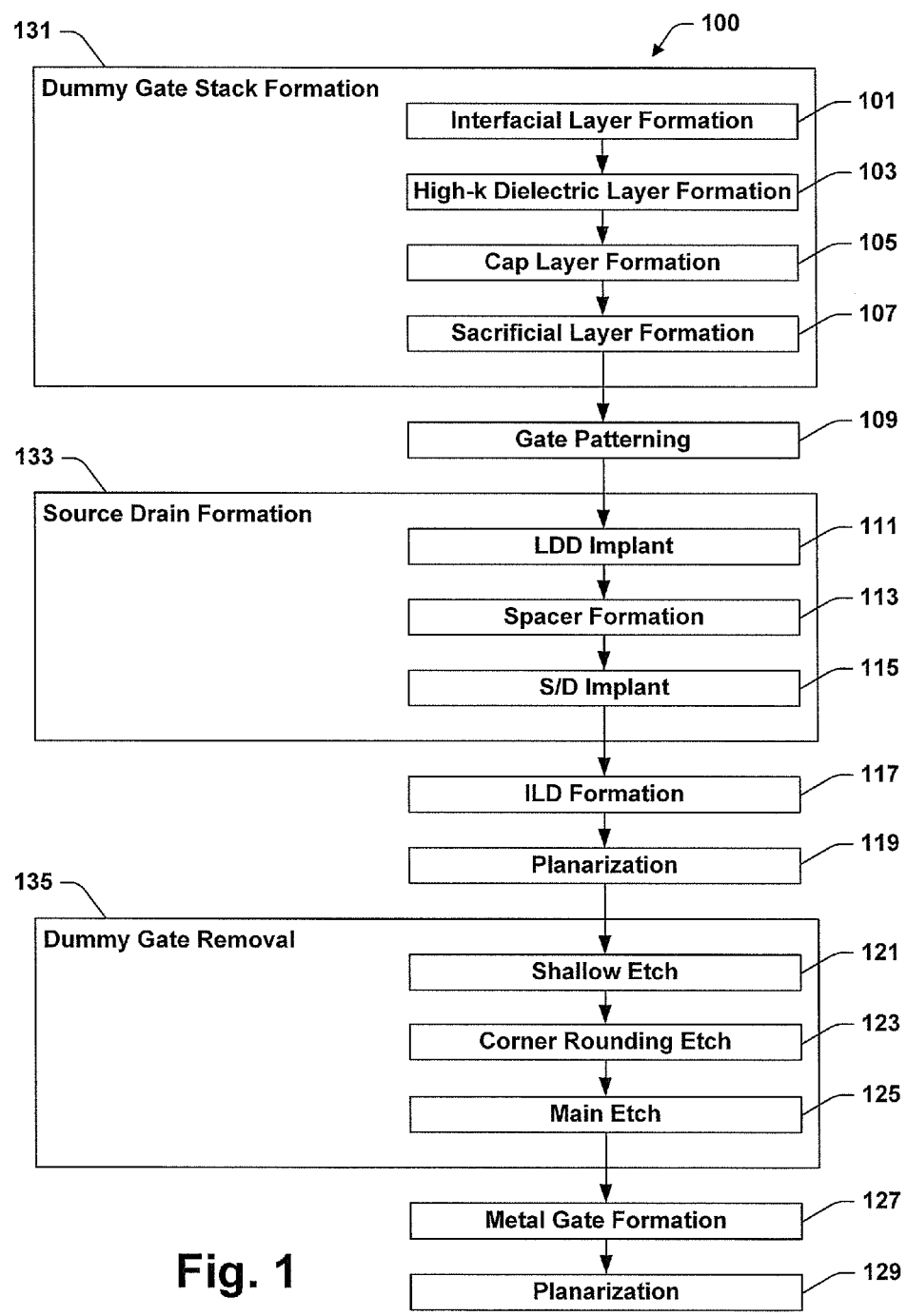
FIG. 1 provides an exemplary process of the present disclosure.

FIG. 1 is an exemplary replacement gate process 100 of the present disclosure. FIGS. 2 through 12 illustrate a substrate 200 as it progresses through the process 100. The substrate 200 is a semiconductor device at an intermediate stage of manufacture. The process 100 can be applied to any semiconductor device and does not require the specific features of the substrate 200.

The substrate 200 includes a semiconductor 201. Examples of semiconductors include, without limitation, silicon, silicon on insulator (SOI), Ge, SiC, GaAs, GaAlAs, InP, GaN SiGe. The semiconductor 201 can be of the n-type or the p-type. The process 100 adds metal oxide semiconductor field effect transistors (MOSFETs) to the substrate 100. These can be of the n-type, the p-type or both. One or more regions of the semiconductor 201 can be doped to vary the conductivity type. The substrate 200 can have n-well regions, p-well regions, or both. As an example and with reference to FIG. 2, the substrate 200 can include an isolation region 231 that isolates an n-doped region 216 from a p-doped region 218. The isolation region 231 is generally a shallow trench isolation (STI) region but can also be an isolation region based on local oxidation of silicon (LOCOS). The isolation region 231 is filled by a suitable dielectric. Examples of dielectrics that can be suitable for the isolation region 231 include, without limitation, silicon oxide, silicon nitride, silicon oxynitride, and multiple layers or combinations thereof.

The sequence of steps 131, which includes steps 101, 103, 105, and 107 forms a dummy gate stack 226 on the substrate

Figure 2:
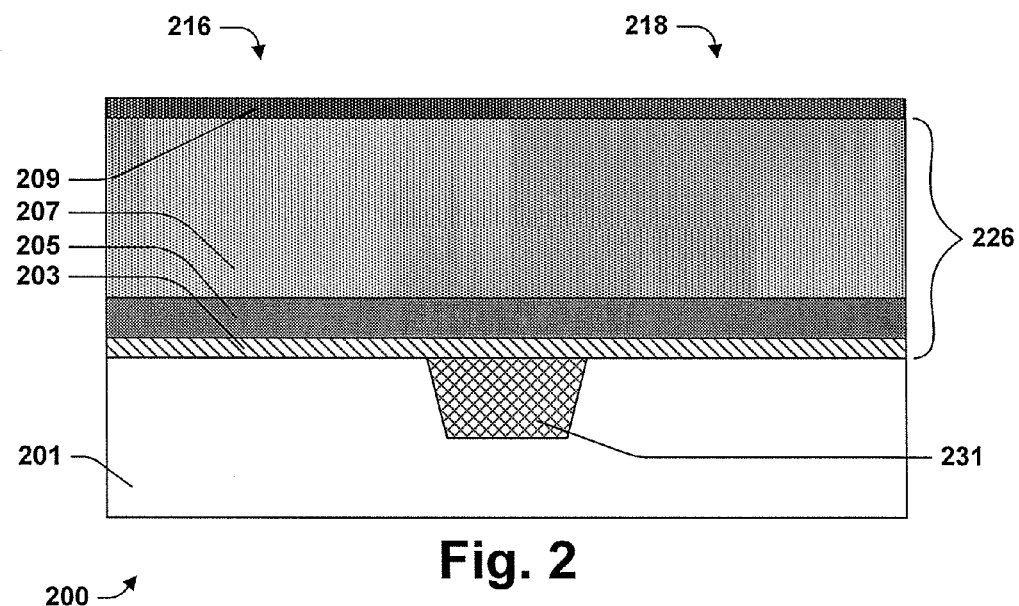
FIG. 2 illustrates an exemplary semiconductor device following formation of a dummy gate stack.

200 as shown in FIG. 2. The dummy gate stack 226 includes an optional interfacial layer (not shown), a high-k dielectric layer 203, a capping layer 205, and a sacrificial layer 207.

Step 101 is an optional step of forming an interfacial layer. The interfacial layer is at the interface between the semiconductor 201 and the high-k dielectric layer 203. The interfacial layer typically comprises silicon dioxide or silicon oxynitride. An interfacial layer can form spontaneously as a result of wet cleans of the substrate 200 prior to the formation of the semiconductor 201 or as a result of interaction between the high-k dielectric layer 203 and the semiconductor 201 during or subsequent to formation of the dielectric layer 203. Intentionally forming the interfacial layer by step 101 can provide a higher quality interface. The interfacial layer is generally made very thin to minimize the interfacial layer's contribution to the overall equivalent oxide thickness of the resulting gates. The thickness is generally in the range from 1 to 20 Angstroms.

The interfacial layer can be formed by any suitable process. An interfacial layer of $SiO_2$ can be formed on a silicon substrate by chemical oxidation, for example, by treating the semiconductor 201 with hydrofluoric acid (HF) immediately prior to depositing the high-k dielectric layer 203. Another option for a silicon substrate is to thermally grow the oxide layer followed by a controlled etch to provide the desired layer thickness. In some cases, the interfacial layer can be formed after the high-k dielectric layer 203. For example, a silicon oxynitride interfacial layer can be formed by annealing a substrate 200 with a silicon semiconductor 201 and a hafnium-based high-k dielectric layer 203 in an atmosphere of nitric oxide. This later process has advantages such as reduced queue time.

Step 103 is forming a high-k dielectric layer 203. The high-k dielectric layer 203 includes one or more layers of one or more high-k dielectric materials. High-k dielectrics are expected to have a dielectric constant at least 5 times that of silicon dioxide. Examples of high-k dielectrics include hafnium-based materials such as $HfO_2$, HfSiO, HfSiON, HfTaO, HfTiO, HfZrO, and $HfO_2$—$Al_2O_3$ alloy. Additional examples of high-k dielectrics include, without limitation, $ZrO_2$, $Ta_2O_5$, $Al_2O_3$, $Y_2O_3$, $La_2O_3$, and $SrTiO_3$. The layer 203 typically has a thickness in the range from 5 to 50 Angstroms. High-k dielectric layer 203 can be formed by any suitable process. Examples of processes that can be used include, without limitation, chemical vapor deposition (CVD) and atomic layer deposition (ALD).

Step 105 is forming a capping layer 205. Capping layer 205 can protect high-k dielectric layer 203 during subsequent processing and provide an etch stop layer for when the sacrificial layer 207 is removed. The capping layer 205 can include one or more layers of suitable materials. Suitable materials can include, for example, TiN and TaN. The capping layer can be formed by any suitable deposition process and to any suitable thickness. Deposition processed include CVD, ALD, and electroplating.

Step 107 is forming a sacrificial layer 207. The sacrificial layer 207 is typically polysilicon, although other materials can be used. The sacrificial layer 207 can be formed by any suitable process. For example, a polysilicon sacrificial layer 207 can be formed by pyrolyzing silane.

Step 109 is patterning the dummy gate stack 226 to form dummy gates 228. Dummy gates 228 may be patterned to define one or more regions of high gate density, which is typical for a core area of an integrated circuit device, and regions of low gate density, which is typical for a peripheral or input/output area of an integrated circuit device.

Figure 3:
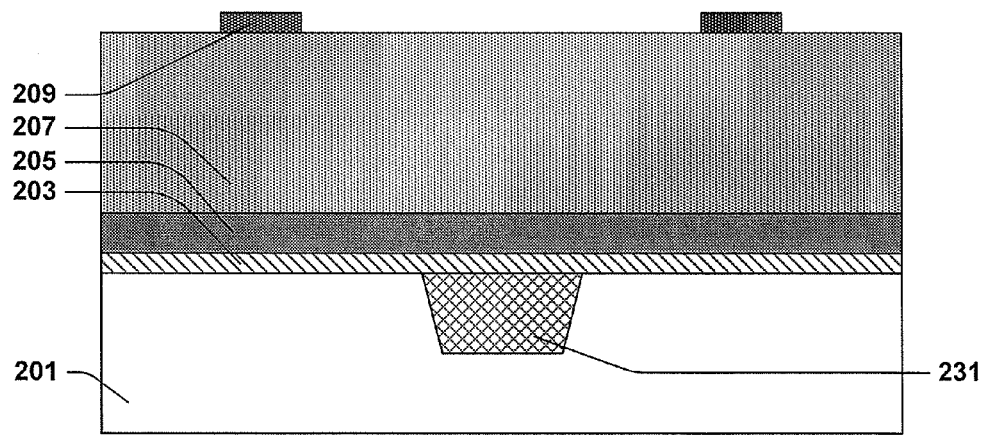
FIG. 3 illustrate the structure of FIG. 2 following patterning of a mask for etching to form dummy gates.

Patterning can be accomplished by any suitable process. Typically, patterning includes photolithography. Photolithography includes coating the substrate 200 with a photoresist, selectively exposing the photoresist according to a desired pattern, developing the photoresist, and using the pattern photoresist as an etch mask. The patterned photoresist can be used as a mask to etch the dummy gate stack 226. Alternatively, the photoresist is used to pattern a hard mask layer. A hard mask layer, if used, is formed before the photoresist. The example process 100 uses a hard mask. The patterned hard mask 209, shown in FIG. 3, is used as a mask to etch the dummy gate stack 226 to form dummy gates 228. Any etch process or combination of etch processes can be used to etch the dummy gate stacks 226.

Figure 4:
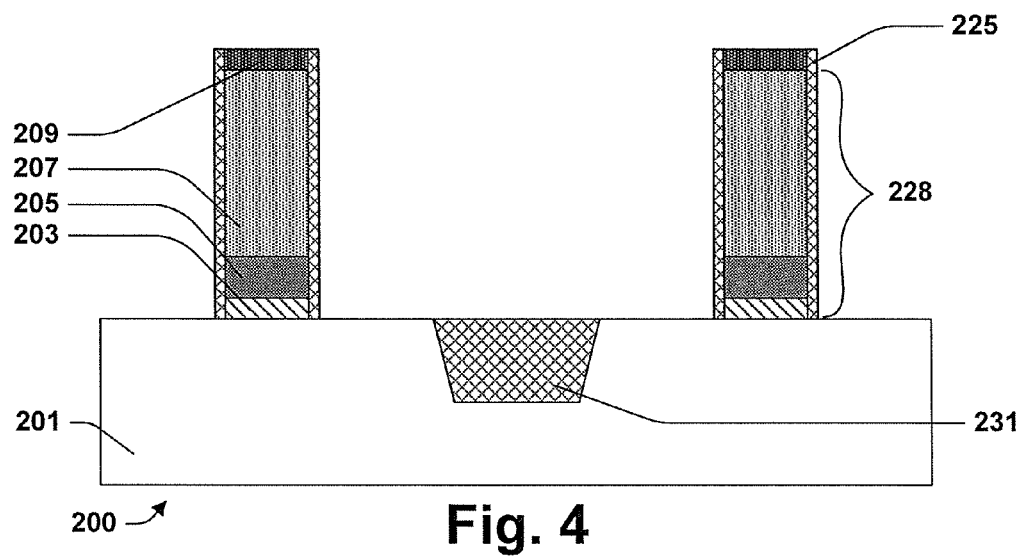
FIG. 4 illustrates the structure of FIG. 3 following formation of the dummy gates.

A typical process for etching the dummy gates stack 226 includes a plasma etch. Reactive gases can interact with the substrate 200 during plasma etching to produce volatile byproducts that subsequently redeposit on nearby surfaces. This can result in the formation of a passivation layer 225 on the sidewalls of dummy gates 228, as illustrated in FIG. 4. The passivation layer 225 can be silica or a similar material such as a silicate.

The following step, sequence 133, which includes steps 111, 113, and 115, implants source and drain regions 227, including lightly doped source and drain regions 229. Source and drain regions can be formed by any suitable sequence of processes or steps. A suitable process sequence can include ion implantation, photolithography processes, and annealing. The doping species depends on the semiconductor doping type and can differ between the n-doped region 216 and the p-doped region 218.

Step 111 is forming lightly doped source and drain regions 229. Step 111 can include an ion implantation process that uses dummy gate stacks 228 to help control the implant distribution. Step 113 forms spacers 221. Before forming spacers 221, optional spacer liners 223 are typically formed. Spacer liners 223 can be of any suitable material, with silica or similar material such as silicate being most typical. The material of spacer liners 223 can be similar to the material of the passivation layer 225 if both layers are present. Generally, either the passivation layer 225, the spacer liner 223, or both will be present. The spacers 221 can be of any suitable material, with silicon nitride being most typical. Step 115 provides the main doping for source and drain regions 227. Step 115 can use any suitable process. The doping processes are typically an ion implantation using spacers 221 to help define the implant distribution.

Figure 5:
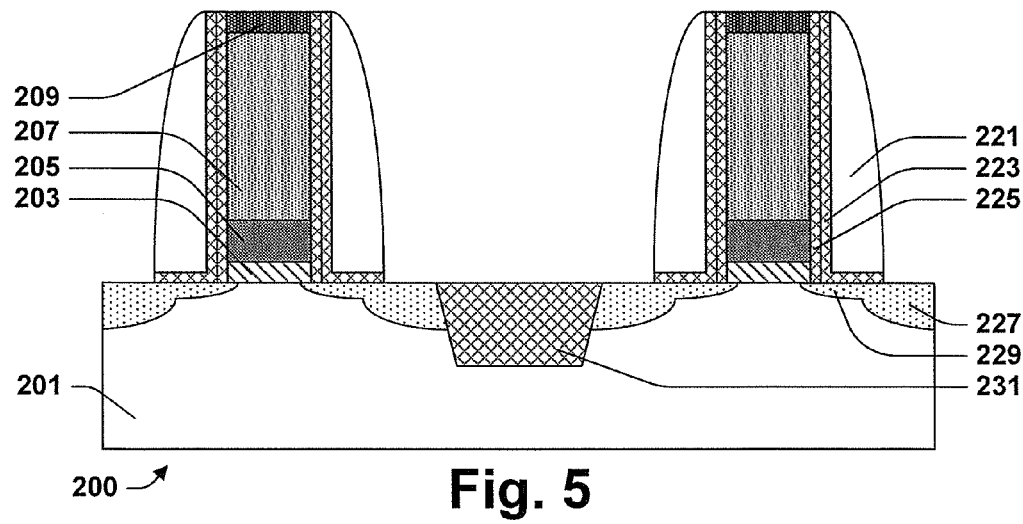
FIG. 5 illustrates the structure of FIG. 4 following formation of sidewall spacers and doping to form source and drain regions.

After ion implanation, the substrate 200 is generally annealed to repair implant damage and activate the dopants. Annealing is carried out before step 127, which is filling trenches 210 with metal 211 (see FIG. 8). Metal 211 generally includes at least one metal that would be adversely affected by an annealing process used to form source and drain regions 227. The resultant structure is illustrated in FIG. 5 in one embodiment.

Figure 6:
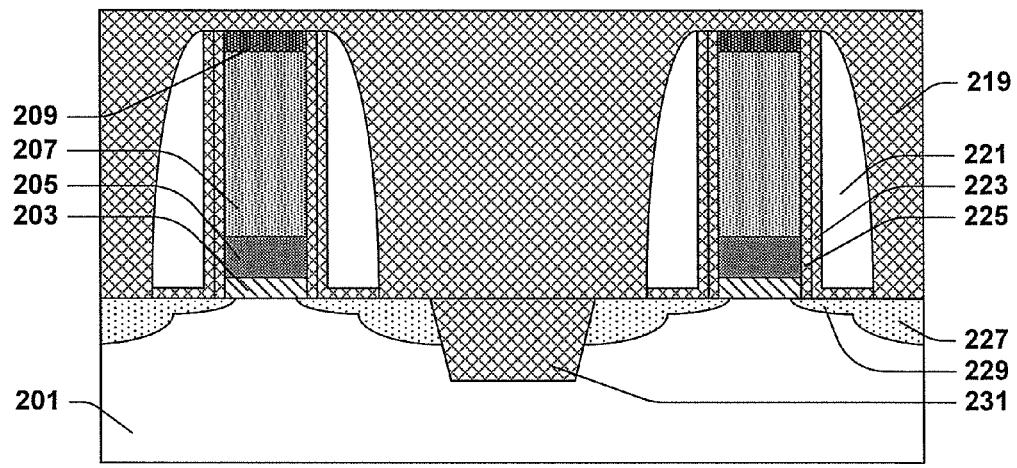
FIG. 6 illustrates the structure of FIG. 5 following formation of an inter-level dielectric layer.

Step 117 is forming an inter-level dielectric (ILD) layer 219, as illustrated in FIG. 6. Any suitable dielectric can be used. Examples include silica ($SiO_2$) and silicates such as phosphosilicate glass (PSG), borosilicate glass, borophosphosilicate glass (BPSG), fluorinated silica glass, and carbon doped silicon oxide. ILD layer 219 can be a low-k dielectric layer. ILD layer 219 can be multilayer structure including a plurality of dielectrics. A typical ILD layer 219 is PSG, which can be deposited by any suitable process.

Figure 7:
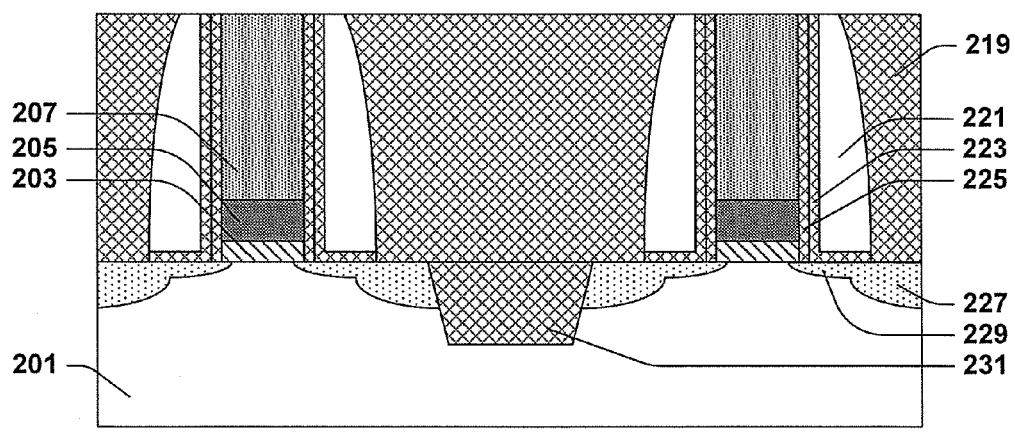
FIG. 7 illustrates the structure of FIG. 6 following planarization.

Step 119 planarizes the upper surface of substrate 200 and lowers the surface to the level of the sacrificial layer 207. Planarization is generally accomplished by chemical mechanical polishing (CMP). The surface does not become truly planar, as CMP invariably removes disparate materials at rates that vary at least slightly. If the mask 209 is still present at this stage, it is removed by the planarization process. After step 119, the sacrificial layer 207 is either exposed or covered by only a thin layer of material. After step 119, the sacrificial layer 207, the passivation layer 225, the spacer liner 223, the spacers 221, and the ILD layer 219 all rise to approximately the same height, as illustrated in FIG. 7.

The next series of steps, including steps 121, 123, and 125, is the dummy gate etch 135. The dummy gate etch 135 removes the sacrificial layer 207 to form trenches 210. Although this process can be referred to as a dummy gate removal process, the etch process 135 stops on the capping layer 205 and does not remove portions of the dummy gates 228 below the sacrificial layer 207 in one embodiment.

The process 100 is particularly adapted to form gates having small critical dimensions and challenging aspect ratios. Accordingly, the trenches 210 can have widths of 50 nm or less. The widths can be 30 nm or less, and approximately 28 nm in particular in one embodiment. Trenches 210 have a depth that spans the distance from the capping layer 205 to the upper surface of ILD layer 219, which generally remains aligned with the upper surface of spacers 221 through the dummy gate etch 135. Even for the smallest of these widths, the depth can be 50 nm or greater, e.g., 55 nm. The aspect ratio (depth to width) can be 1:1 or greater and is typically in the range from 1:1 to 2:1. Trenches 210 are generally in a core area having a high device density, but are not so limited.

The substrate 200 can include trenches other than trenches 210. These other trenches may have different dimensions and can be formed either simultaneously or separately. Wider trenches would typically be located in a peripheral area of the substrate 200 where device density is low. The process 100 has the advantage of being able to effectively etch narrow trenches with challenging aspect ratios while also imparting a vertical profile to trenches that are broader, have less challenging aspect ratios, or both.

Figure 8:
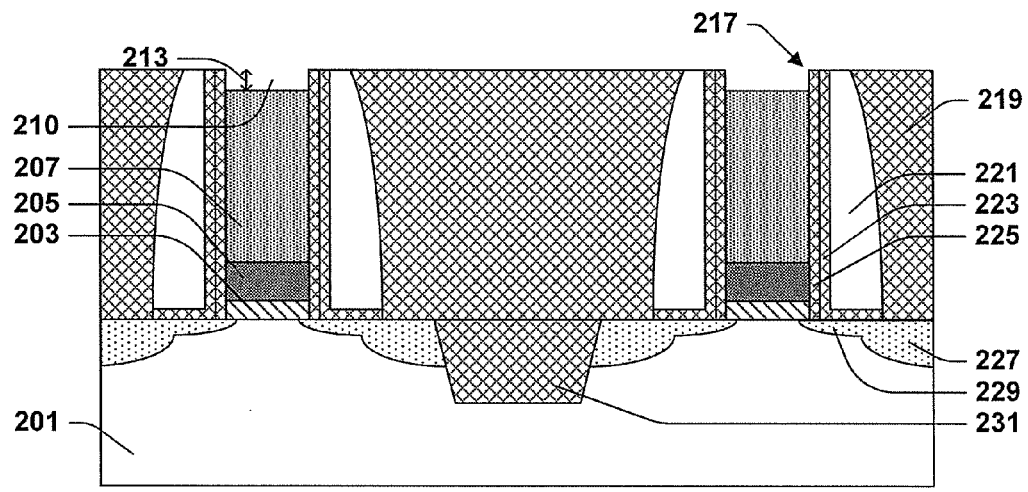
FIG. 8 illustrates the structure of FIG. 7 after etching to begin trench formation.

Trench formation, also referred to as dummy gate etch 135, proceeds in three stages. The first stage, represented by step 121, forms the trenches 210 to a shallow depth 213 and leaves exposed corners 217 at the entrances of trenches 210 as shown in FIG. 8. The depth 213 represents only a fraction of the final trench depth. The fraction can be in the range from one tenth to one half the final depth, and is generally one third or less. The depth 213 is generally in the range from 5 to 20 nm, with 10 to 15 nm being most typical.

Step 121 can include a break through etch. A layer of material may be present on the surface of the sacrificial layer 207 that is difficult to etch by the conditions best suited to etching the sacrificial layer 207. For example, a layer of $SiO_2$ may form on the surface of a polysilicon sacrificial layer 207. A break through etch is usually a non-selective (isotropic) etch. Step 121, however, requires an etch that preferentially removes the sacrificial material whereby the trenches 210 begin to form and corners 217 are exposed. Etch conditions that are effective to remove a surface layer may tend to equally remove the materials that surround the trenches 210. The surrounding material can include one or more of the materials that make up the passivation layer 225, the spacer liner 223, and the spacers 221.

If step 121 includes a break through etch, the etch conditions will generally have an intermediate level of selectivity between the sacrificial material, e.g., polysilicon, and surrounding materials, e.g., silicon nitride, silica, and silicate. An intermediate level of selectivity can be in the range from 2:1 to 10:1. A selectivity of 5:1 or greater is desirable, whereby lateral etching is primarily restricted to the second stage. These are ratios of etch rates per unit area for the etch process conditions. The ratios are determined for the materials independent of geometric factors particular to their organization on substrate 200.

A break through etch may not be required. If a break through etch is required, it can be carried out prior to step 121. In either of these cases, step 121 can use an etch that is highly selective for removing the sacrificial layer 207 in comparison to one or more of the surrounding materials. A high level of selectivity is generally at least 10:1 and can include purely anisotropic processes that essentially remove only material of the sacrificial layer 207.

At the conclusion of step 121, the corners 217 generally have a small radius of curvature. A small radius of curvature is typically 1 nm or less. The radius of curvature of the entrance corners is determined from a trench profile shape that is averaged over a large number of similarly situated trenches. The profile has a radius of curvature that varies from the bottom of the trench to the top, reaching a minimum as profile rounds the top corner 217. The radius of curvature for the top corner 217 is that minimum.

Figure 9:
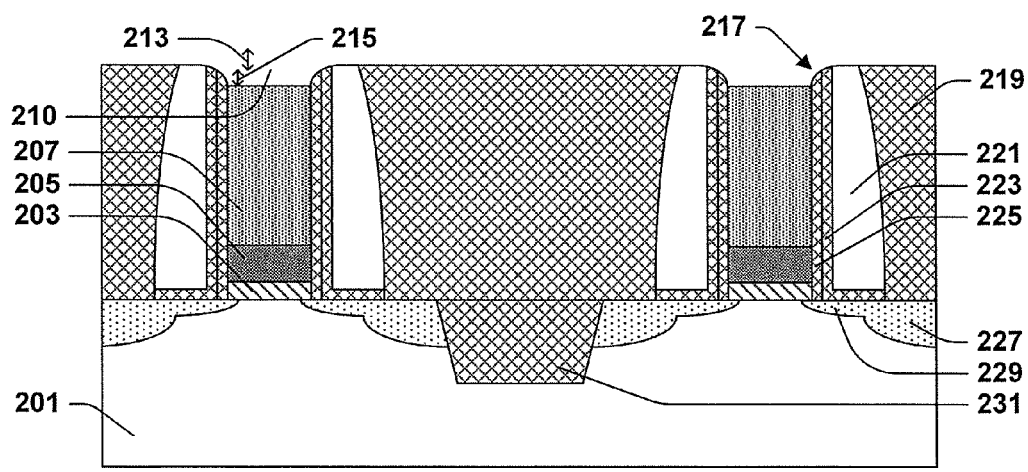
FIG. 9 illustrates the structure of FIG. 8 following a corner rounding etch.

Step 123, the second stage, rounds the corners 217 as shown in FIG. 9 and imparts the trenches 210 with a reentrant profile. The corners are rounded substantially, with the radius of curvature increasing by more than a factor of two. Typically, the corners 217 are rounded to a radius of curvature that is 10-50% of the width of trenches 210. Typically, the radius of curvature is increased to a value in the range from 2 nm to 10 nm. Rounding the corners 217 facilitates the third stage etch, results in a more consistent trench profile, and leads to a more consistent metal back fill in step 127.

The corners 217 are rounded primarily in the second stage as compared to the first stage, the third stage, or all three stages. The radius of curvature for the corners 217 can be considered zero prior to the first stage. The radius of curvature grows to a first value over the first stage 121, a second value over the second stage 123, and a third value over the third stage 125. The growth over the second stage 123, which is the difference between the second and the first value, is greater than the growth over either of the other stages, or both combined. The growth over the second stage 123 is generally twice or more the growth over either the first stage 121, the third stage 125, and both combined.

Rounding in the second stage 123 is more desirable than rounding in either the first stage 121 or the third stage 125. Rounding in the first stage 121 tends to reduce the height of the trenches 210 by removing material across the surface of the substrate 210. Rounding in the third stage is less desirable in that it tends to broaden the trenches 210 and cause the trench width to vary excessively from top to bottom. Substantially restricting corner rounding to the second stage is desirable for maintaining a vertical trench profile. The process 100 can provide narrow trenches 210 with walls that are vertical to the extent that the width 10% of the trench height from the trench top is within 10% of the trench width at the trench bottom.

The corners 217 are rounded by a process that etches the materials that make up the corner 217. These are the materials that surround the trench 210 and can include one or more of the materials that make up the passivation layer 225, the spacer liner 223, the spacers 221. Step 123 uses an etch that has a low selectivity between one or more of these materials and the material of the sacrificial layer. A low selectivity is 2:1 or less and can be a selectivity of 1:1 (isotropic) or less (selectivity in favor of the surrounding materials). The etch can be isotropic, having a selectivity of nearly 1:1, or can have a selectivity that favors removal of one or more of the surrounding materials in comparison to the sacrificial layer material.

Depending on the selectivity of the second stage etch, step 123 can increase the depth of the trenches 210 to some degree. In the example illustrated by FIG. 9, the etch is nearly isotropic and increases the depth of the trenches 210 by the amount 215. This amount is only a fraction of the final trench depth. The fraction can be in the range from nothing to one third, and is generally one quarter or less. The depth 215 is generally in the range from 0 to 15 nm, with 5 to 10 nm being most typical.

Figure 10:
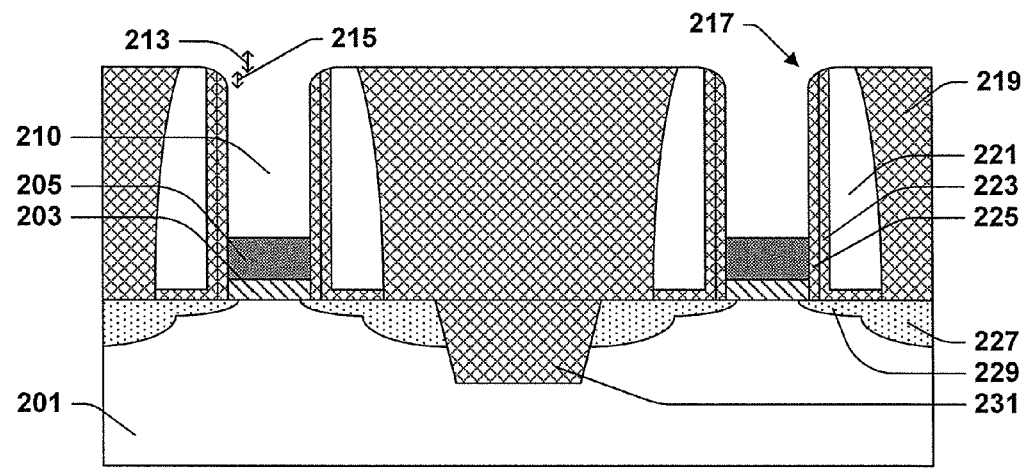
FIG. 10 illustrates the structure of FIG. 9 following a main etch and an over etch to complete trench formation.

Step 125, the third stage, is a main etch that increases the depth of the trenches 210 to the capping layer 205, or to nearly that depth. The third stage completes or nearly completes the formation of the trenches 210, as illustrated in FIG. 10. Step 125 uses an etch that has a high selectivity for removing the material of the sacrificial layer 207 in comparison to the surrounding materials. A high level of selectivity is generally at least 10:1 and can include a nearly anisotropic etch that essentially removes only the sacrificial material. The main etch removes more of the sacrificial layer 207 than the first stage, the second stage, or both stages combined. The main etch generally removes at least twice the amount of the sacrificial layer 207 than either the first stage, or the second stage. The fraction of the final trench depth removed during the third stage is generally in the range from 50 to 90% and is usually 60-90%. The depth removed in the third stage is generally in the range from 20 to 100 nm, with 35 to 55 nm being most typical.

The main etch can be followed by an over etch. An over etch is used to complete the formation of trenches 210 while avoiding damage to the capping layer 205. As the capping layer 205 is becoming exposed, a switch can be made from the main etch conditions to the over etch conditions. The over etch conditions may be less selective than the main etch conditions. However, as the over etch is relatively brief its contributions, if any, to rounding of the corners 217, decreasing the height of the trenches 210, and varying the profile of trenches 210, is generally minimal.

The dummy gate etch 135 removes some of the surrounding materials. This can lower the height of the passivation layer 225 and the spacer liner 223 in comparison to the ILD layer 219. This is primarily due to the corner rounding etch 123, whereby any such reduction in height occurs mostly or exclusively in the second stage. The reduction in height is preferably limited whereby passivation layer 225, the spacer liner 223, or both continue to line most of the high of the trenches 210 after dummy gate etch 135. The dummy gate etch 135 generally leaves the passivation layer 225 and the spacer liner 223 at 2 to 15% the height of the spacers 221 over the capping layer 205.

While the dummy gate etch 135 can remove some of the spacers 221, it is preferable for the dummy gate etch 135 to cause little or no reduction in the height of the spacers 221 in comparison to the height of the ILD layer 219. Any reduction in height of the spacers 221 is generally less than half the reduction in height of either the passivation layer 225, the spacer liner 223, or both. If the spacers 221 are slightly reduced in height by the dummy gate etch 135, the ILD layer 219 can be brought down to the height of the spacers 221 during the planarization step 129. In this way, the spacers 221 can line the tops of the trenches 210. By keeping the reduction in height of spacers 221 minimal, this leveling can be accomplished without excessively reducing the thickness of the ILD layer 219 or the height of the gates 228.

All three stages of dummy gate etch 135 are generally plasma etches. While the etch conditions vary over the three stages, the entire process 135 can generally be carried out in one etch chamber, which is advantageous in terms of reducing processing time. Suitable etch process conditions depend on the material selections. The etch conditions for the third stage 125 can be conventional conditions for the main etch in a dummy gate replacement process. The first stage 121 can use the same conditions as the third stage 125, or break through etch conditions if those are suitable as described above. Alternatively, the second stage can use an intermediate state between break through etch conditions and main etch conditions.

The second stage uses conditions that are selected to provide the desired corner rounding. Suitable conditions depend on the materials being used. The following example is operative if the sacrificial layer is polysilicon, the spacers 221 are silicon nitride or a material with similar etch susceptibility, and that the other surrounding materials are $SiO_2$ or materials with similar etch susceptibility. The other surrounding materials can be the passivation layer 225, the spacer liner 223, or both.

As an example, the corner rounding etch 123 can be a plasma etch at a relatively low pressure, e.g., a pressure in the range from 2 mT to 10 mT. By contrast, the first stage 121 and the main etch are generally carried out at a pressure above 10 mT. A suitable gas composition include 50-90% $CHF_3$, 20-30% HBr, 10-50% $O_2$, and inert gases such as Ar and He. Source power can be in the range from 500-1000W. Source bias can be in the range from 0-30W. Different conditions can also be used.

$CHF_3$ is desirable in the corner rounding etch 123 in that it can be used to tune the etch rate selectivity between dense feature regions and isolated feature regions of the substrate 200. The corner rounding process may not be beneficial in the isolated feature regions. Accordingly, the $CHF_3$ concentration can be selected to provide a higher etch rate for one or more of the passivation layer 225, the spacer liner 223, or the spacers 221 in dense device regions as compared to isolated device regions.

Figure 11:
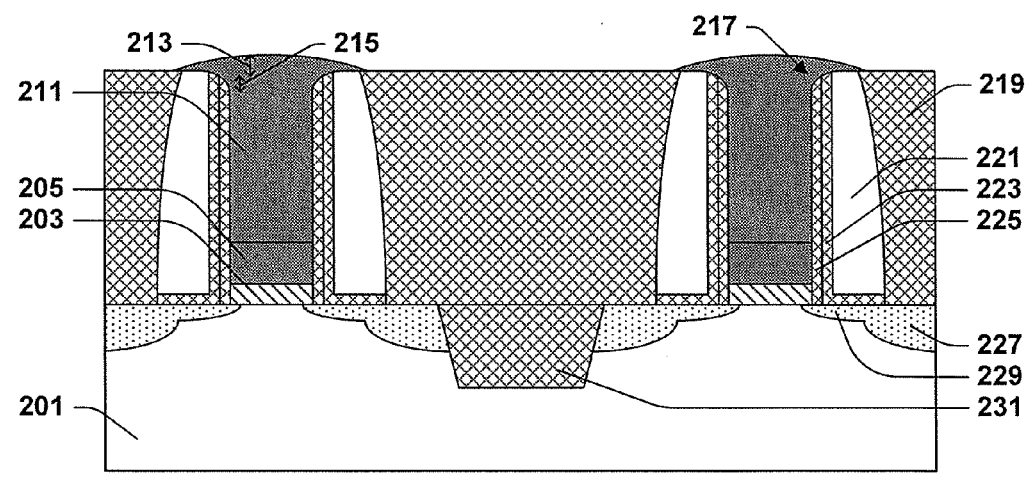
FIG. 11 illustrates the structure of FIG. 10 following filling the trenches with metal.

Step 127 fills the trenches 210 with metal 211, as illustrated in FIG. 11. Prior to filling with metal, the sidewalls and bottom of the trenches 210 can be coated with a liner layer. Examples of liner layers include $SiO_2$, SiN, and SiON. Generally, however, the dummy gate etch 134 leaves intact surrounding materials to make an additional liner layer unnecessary. While FIG. 11 illustrates a selective deposition of metal within the trenches 210, it should be understood that such a deposition may correspond to a blanket deposition over all the exposed surfaces.

The metal 211 generally includes multiple layers of differing compositions. Different metals can be used in different regions of the substrate 200. A bottom layer can be a work function metal. Examples of work function metals include, without limitation, one or more layers of Ti, TiN, TaN, Ta, TaC, TaSiN, W, WN, MoN, and MoON. Additional metal layers can include one or more middle layers and a top layer. These additional layer can be of any suitable metals. Examples of metals that could be used include, without limitation, ruthenium, palladium, platinum, cobalt, nickel, hafnium, zirconium, titanium, tantalum, aluminum, and conductive carbides, oxides, and alloys of these metals. The metal layers may be formed by any suitable process or combination of processes. Physical vapor deposition (PVD) is a typical process. Examples of other metal layer formation process that can be used include electroplating, electroless plating, ALD, and CVD.

Figure 12:
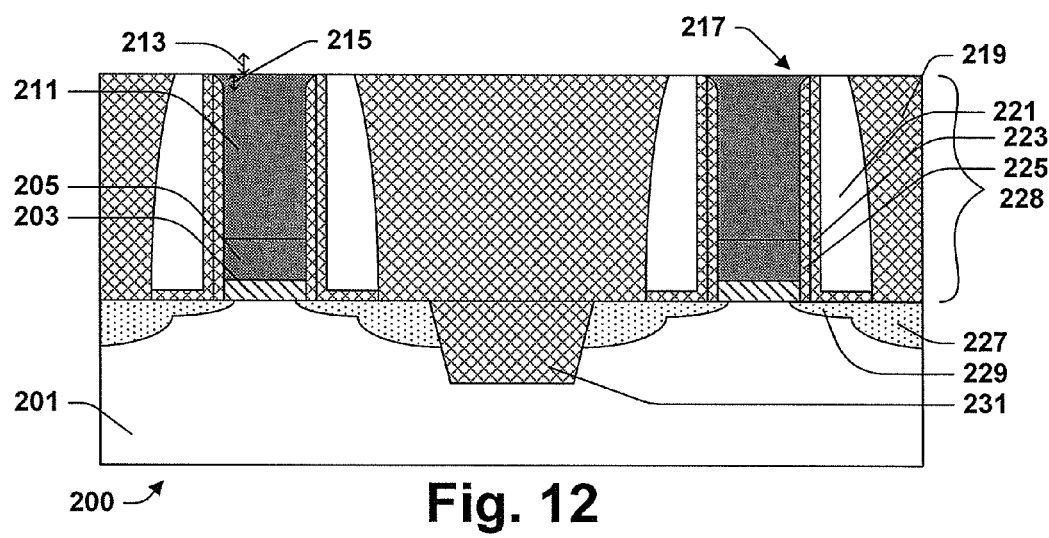
FIG. 12 illustrates the structure of FIG. 11 following planarization.

Step 129 is another planarization step and is typically chemical mechanical polishing to produce the substrate 200 as shown in FIG. 12. The substrate 200 as shown in FIG. 12 is a semiconductor device at an intermediate stage of manufacture. Additional processing will generally be carried out, particularly back end of line (BEOL)

The invention as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one invention and the following claims do not necessarily encompass every concept, aspect, embodiment, or example described herein.

The invention claimed is:

1. A method of fabricating a semiconductor device with metal gates, the method comprising:
   providing a substrate;
   forming a dummy gate stack on the substrate, the dummy gate stack including a high-k dielectric layer, a capping layer above the high-k dielectric layer, and a sacrificial layer above the capping layer;
   patterning the dummy gate stack to form dummy gates;
   doping source and drain regions for the gates;
   forming an inter-level dielectric layer that covers the source and drain regions;
   over at least a first region of the substrate, removing the sacrificial layer from the dummy gates to form trenches that expose the capping layer; and
   filling the trenches with metal to form metal gates;
   wherein removing the sacrificial layer from the dummy gates to form trenches includes sequentially a first stage, a second stage, and a third stage;
   the first stage begins the trenches, the trenches having entrance corners;
   the second stage is an etch that rounds the corners;
   the third stage increases the depth of the trenches down to the capping layer;
   the third stage increases the depth of the trenches at least twice as much as the second stage; and
   the second stage increases the trench corner rounding, measured as a radius of curvature, more than the third stage.

2. The method of claim 1, further comprising:
   performing a high temperature anneal to activate the source and drain doping;
   wherein doping the source and drain regions comprises ion implantation.

3. The method of claim 1, wherein:
   the substrate comprises a second region having a lower gate density than the first region; and
   the second stage etch uses conditions that provide preferential etching in regions of high gate density as compared to regions of low gate density.

4. The method of claim 3, wherein the second stage etch uses $CHF_3$ and the device density dependence of the etch rate varies with the $CHF_3$ concentration.

5. The method of claim 1, wherein the trenches have a critical dimension and the trench corners are rounded to a radius of curvature that is 10 to 50% of the critical dimension.

6. The method of claim 5, wherein the trenches have a critical dimension of 50 nm or less.

7. The method of claim 1, wherein
   the trenches have a mean width of 50 nm or less; and
   the corners are rounded to a radius of curvature within the range from 2 nm to 10 nm.

8. The method of claim 1, wherein:
   the trenches have a depth and a width that varies from bottom to top; and
   the trench width 10% of the depth from the top is within 10% of the trench width at the bottom.

9. The method of claim 1, wherein the first stage removes from 10 to 50% of the sacrificial layer.

10. The method of claim 1, further comprising:
    planarizing after forming the inter-level dielectric layer and before removing the sacrificial layer from the dummy gates;
    wherein the sacrificial layer has a height following planarization and the third stage removes a thickness of the sacrificial layer that is at least 60% of that height.

11. A method of fabricating a semiconductor device with metal gates, the method comprising:
    providing a substrate;
    forming a dummy gate stack on the substrate, the dummy gate stack including a high-k dielectric layer, a capping layer above the high-k dielectric layer, and a sacrificial layer above the capping layer;
    patterning the dummy gate stack to form dummy gates;
    doping source and drain regions for the gates by processing that includes forming spacers adjacent the dummy gate stacks, the spacers being formed of a spacer material;
    over at least one region of the substrate, removing the sacrificial layer from the dummy gates to form trenches that expose the capping layer; and
    filling the trenches with metal to form metal gates;
    wherein removing the sacrificial layer from the dummy gates to form trenches includes sequentially a first stage, a second stage, and a third stage;
    the first stage begins the trenches and includes a plasma etch having a selectivity greater than 2:1 for removing the sacrificial layer material over the spacer material;
    the second stage includes a plasma etch that has a selectivity of 2:1 or less for removing the sacrificial layer material over the spacer material; and
    the third stage includes a plasma etch that has a selectivity greater than 10:1 for removing the sacrificial layer material over the spacer material.

12. The method of claim 11, wherein the sacrificial layer material is primarily polysilicon and the spacer material is primarily silicon nitride.

13. The method of claim 11, wherein the first stage includes a plasma etch that has a selectivity greater than 5:1 for removing the sacrificial layer material over the spacer material.

14. The method of claim 11, wherein the second stage plasma etch is carried out at a pressure of 10 mT or less, and the third stage etch is carried out at a pressure greater than 10 mT.

15. A method of fabricating a semiconductor device with metal gates, the method comprising:
    providing a substrate;
    forming a dummy gate stack on the substrate, the dummy gate stack including a high-k dielectric layer, a capping layer above the high-k dielectric layer, and a polysilicon layer above the capping layer;
    patterning the dummy gate stack to form dummy gates;
    doping source and drain regions for the gates by processing that includes forming spacers adjacent the dummy gate stacks, the spacers being formed of a spacer material;
    forming a layer of silica or silicate that separates the dummy gate stacks from the spacers, the silicate layer being either a byproduct of patterning the dummy gate stack, a spacer liner formed prior to the spacers, or a combination of both;

over at least one region of the substrate, removing the polysilicon layer from the dummy gates to form trenches that expose the capping layer; and filling the trenches with metal to form metal gates;

wherein removing the sacrificial layer from the dummy gates to form trenches includes sequentially a first stage, a second stage, and a third stage;

the first stage begins the trenches and includes a plasma etch having a selectivity greater than 2:1 for removing polysilicon over the silica or silicate;

the second stage includes a plasma etch that has a selectivity of 2:1 or less for removing polysilicon over the silica or silicate; and the third stage includes a plasma etch that has a selectivity greater than 10:1 for removing polysilicon over the silica or silicate.

16. The method of claim 15, wherein the first stage includes a plasma etch that has a selectivity greater than 5:1 for removing polysilicon over the silica or silicate.

17. The method of claim 15, wherein:

immediately prior to removing the polysilicon layer from the dummy gates to form trenches, the spacers and the layer of silica or silicate rise to an equal height over the capping layer; and the process of removing the polysilicon layer removes an upper portion of the layer of silica or silicate to reduce the height of the silica or silicate layer to below the height of the spacers.

18. The method of claim 17, wherein the majority of the reduction in height of the silica or silicate layer occurs during the second stage.

19. The method of claim 17, wherein after removing the sacrificial layer the height of the silica or silicate layer is 2 to 15% less than the height of the spacers over the capping layer.

20. The method of claim 17, wherein the process of removing the sacrificial reduces the height of the silica or silicate layer at least twice as much as it reduces the height of the spacers.

* * * * *